(12) United States Patent
Becker et al.

(10) Patent No.: US 7,272,809 B2
(45) Date of Patent: Sep. 18, 2007

(54) METHOD, APPARATUS AND COMPUTER PROGRAM PRODUCT FOR IMPLEMENTING ENHANCED HIGH FREQUENCY RETURN CURRENT PATHS UTILIZING DECOUPLING CAPACITORS IN A PACKAGE DESIGN

(75) Inventors: Darryl John Becker, Rochester, MN (US); Daniel Douriet, Round Rock, TX (US); Matthew Stephen Doyle, Rochester, MN (US); Andrew B. Maki, Rochester, MN (US); Joel David Ziegelbein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 725 days.

(21) Appl. No.: 10/712,536

(22) Filed: Nov. 13, 2003

(65) Prior Publication Data

US 2005/0108671 A1 May 19, 2005

(51) Int. Cl.
*G06F 17/50* (2006.01)

(52) U.S. Cl. .......................... 716/10; 716/12

(58) Field of Classification Search .............. 716/8–15; 333/12; 365/51, 52; 361/117, 782; 257/777
See application file for complete search history.

(56) References Cited

U.S. PATENT DOCUMENTS

| | | | | |
|---|---|---|---|---|
| 6,834,427 B2 * | 12/2004 | Cornelius et al. | ............. | 29/840 |
| 6,993,739 B2 * | 1/2006 | Becker et al. | ................ | 716/10 |
| 7,047,515 B1 * | 5/2006 | Vitek et al. | .................. | 716/15 |

* cited by examiner

Primary Examiner—Vuthe Siek
(74) Attorney, Agent, or Firm—Joan Pennington

(57) ABSTRACT

A method, apparatus and computer program product are provided for implementing high frequency return current paths utilizing decoupling capacitors within electronic packages. Electronic package physical design data are received for identifying a board layout. For each of a plurality of cells in a grid of a set cell size within the identified board layout, a respective number of signal vias are identified. A ratio of signal vias to return current paths is calculated for each of the plurality of cells. Each cell having a calculated ratio greater than a target ratio is identified. One or more decoupling capacitors are selectively added within each of the identified cells to provide high frequency return current paths.

17 Claims, 6 Drawing Sheets

METHOD, APPARATUS AND COMPUTER PROGRAM PRODUCT FOR IMPLEMENTING ENHANCED HIGH FREQUENCY RETURN CURRENT PATHS UTILIZING DECOUPLING CAPACITORS IN A PACKAGE DESIGN

FIELD OF THE INVENTION

The present invention relates generally to the data processing field, and more particularly, relates to a method, apparatus and computer program product for implementing high frequency return current paths utilizing decoupling capacitors within electronic packages.

DESCRIPTION OF THE RELATED ART

Electronic packages typically include multiple layers or planes including multiple signal, voltage and ground planes. In high speed package design, closing the return current path of signals that change wiring planes is a key concern to guarantee proper signal integrity. When a high speed signal is traveling down a trace sandwiched between two reference planes, a return current is induced on the adjacent planes.

When the signal changes wiring layers through a via, the return current needs a low impedance path through which it can track the signal. If an adequate path is not supplied for the return current, then signal degradation occurs due to the inductive nature of the added path. Depending on the rise time of the signal, the return current path is required to be electrically close to where the signal changes reference planes.

Previous solutions to this return current concern involved providing low impedance paths at the ends of the net rather than locally where the discontinuity exists. This type of solution was sufficient at relatively lower bus speeds.

A need exists for a mechanism for implementing high frequency return current paths within electronic packages.

SUMMARY OF THE INVENTION

Principal aspects of the present invention are to provide a method, apparatus and computer program product for implementing high frequency return current paths utilizing decoupling capacitors within electronic packages. Other important aspects of the present invention are to provide such method, apparatus and computer program product for implementing high frequency return current paths utilizing decoupling capacitors within electronic packages substantially without negative effect and that overcome some disadvantages of prior art arrangements.

In brief, a method, apparatus and computer program product are provided for implementing high frequency return current paths utilizing decoupling capacitors within electronic packages. Electronic package physical design data are received for identifying a board layout. For each of a plurality of cells in a grid of a set cell size within the identified board layout, a respective number of signal vias are identified. A ratio of signal vias to return current paths is calculated for each of the plurality of cells. Each cell having a calculated ratio greater than a target ratio is identified. One or more decoupling capacitors are selectively added within each of the identified cells to provide high frequency return current paths.

In accordance with features of the invention, the electronic package physical design data include stack-up data for identifying reference voltages referenced by high speed nets and to create pairs of reference voltages to analyze; and a design file for identifying locations of high speed nets, locations of plane change vias, and board dimensions. A grid dimensions input selected by a user defines the set cell size. The target ratio is selected by a user and is equal to a maximum desired ratio of signal vias to return current paths.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
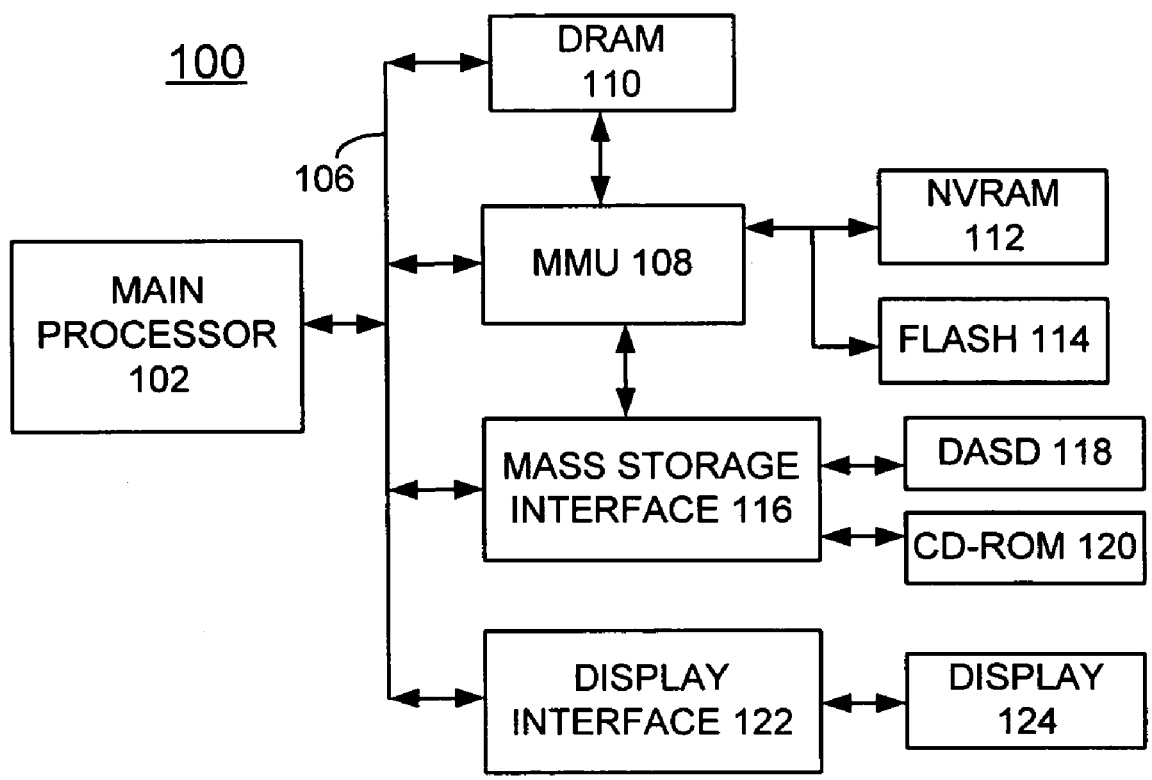
FIGS. 1 and 2 are block diagram representations illustrating a computer system and operating system for implementing methods for implementing high frequency return current paths utilizing decoupling capacitors within electronic packages in accordance with the preferred embodiment.
Figure 2:
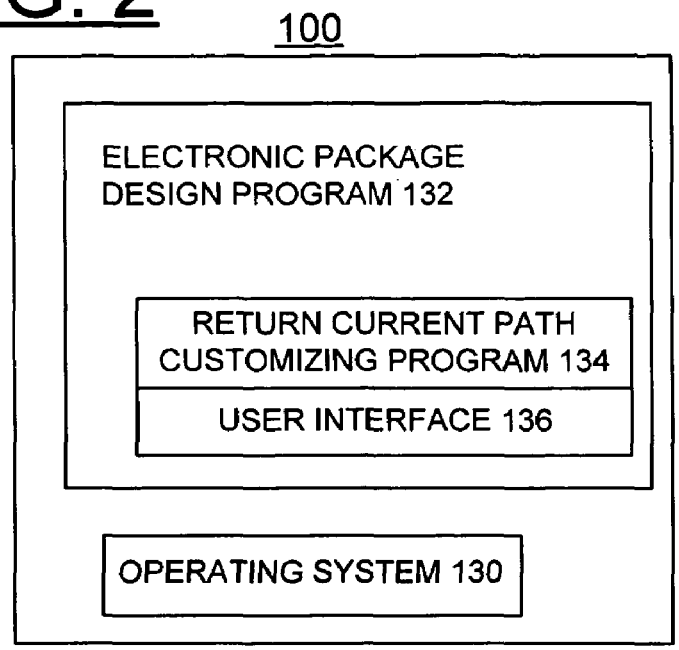

Referring now to the drawings, in FIGS. 1 and 2 there is shown a computer system generally designated by the reference character 100 for implementing high frequency return current paths utilizing decoupling capacitors within electronic packages in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an electronic package design program 132, a return current path customizing program 134 of the preferred embodiment, and a user interface 136.

Various commercially available computers can be used for computer system 100, for example, an IBM personal computer. CPU 102 is suitably programmed by the return current path customizing program 134 to execute the flowchart of FIG. 3 for implementing high frequency return current paths utilizing decoupling capacitors within electronic packages in accordance with the preferred embodiment.

In accordance with features of the preferred embodiment, a method is provided for identifying and resolving insufficient return current locations where there exists only one plane for each voltage and also solves the problem of when a signal changes reference domains when it changes wiring planes. Specifically, this invention creates return current paths by using decoupling capacitors instead of vias alone. This solution is implemented with a minimal amount of time and effort, and in a consistent and reproducible manner.

In accordance with features of the invention, an automated method is provided for identifying and correcting any areas lacking proper return current paths for each of the signals. This includes identifying signals that change wiring layers, while not maintaining consistent reference layers. The method identifies these situations and either applies or recommends the application of one or more decoupling capacitors to maintain a consistent reference.

This invention utilizes the specialized return current path customizing program 134 of the preferred embodiment to determine the number and value of decoupling capacitors that must be added within a specified cell size or board region.

Figure 3:
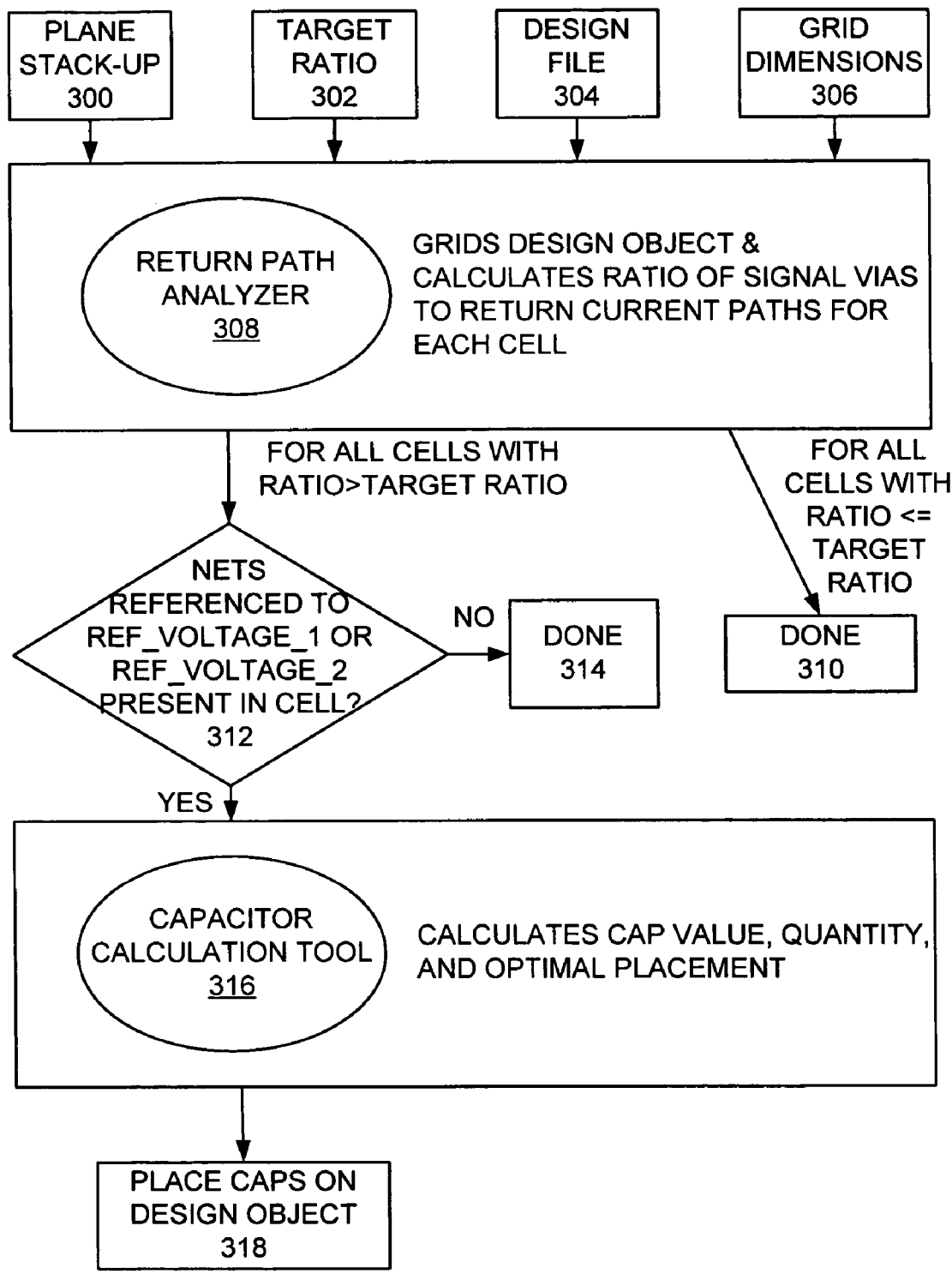
FIG. 3 is a flow chart illustrating exemplary steps for implementing high frequency return current paths utilizing decoupling capacitors in accordance with the preferred embodiment.

Referring now to FIG. 3, there are shown exemplary steps for implementing high frequency return current paths in accordance with the preferred embodiment. Electronic package physical design data are received, reference voltages residing on multiple planes are identified, and pairs of reference voltages to analyze are created from a plane stack-up block 300. A target ratio equal to a maximum signal via to return current path ratio is identified at a target ratio block 302. A determination is made of locations of high speed nets, locations of plane change vias, and board dimensions from a design file as indicated in a block 304. A grid dimensions block 306 defines a grid or cell size. A return path analyzer tool 308 receiving inputs from blocks 300, 302, 304, and 306, calculates a ratio of signal vias to return current paths for each cell to identify cells that have a deficient signal return path. Cells that have a deficient signal return path or a calculated ratio greater than the target ratio are identified for further processing. Based on the relative density of plane changes of switching signals, a qualitative figure of merit is calculated for each cell. As a result, cells that have a deficient signal return path are readily identified. The user then uses this ratio as input to the remaining steps in the flow chart of FIG. 3 to determine what action must be taken. This action optimizes return current paths in a design and ensures signal integrity of all switching signals without significantly impacting design time. The user determines the required target ratio and cell size for each interface (critical signals) depending on design margins. Adding decoupling capacitors can be accomplished through an automated or systematic approach using noise budget and SN ratio as inputs. For cells that have an adequate signal return path or a ratio less than or equal to the target ratio, no further processing is needed as indicated in a block 310.

For all cells with a calculated ratio greater than the target ratio, checking for nets referenced to a first or second reference voltage REF_VOLTAGE_1 or REF_VOLTAGE_2 present in the cell is performed as indicated in a decision block 312. For cells that have no nets referenced to the first or second reference voltage REF_VOLTAGE_1 or REF_VOLTAGE_2 present in the cell, no further processing is needed as indicated in a block 314. Otherwise for cells that have nets referenced to the first or second reference voltage REF_VOLTAGE_1 or REF_VOLTAGE_2 present in the cell, a capacitor calculation tool 316 calculates a capacitance value, a capacitor quantity, and optimal placement for adding one or more decoupling capacitors in the cell. The decoupling capacitors are added to the design object through an automated or systematic approach as indicated in a block 318.

Figure 4:
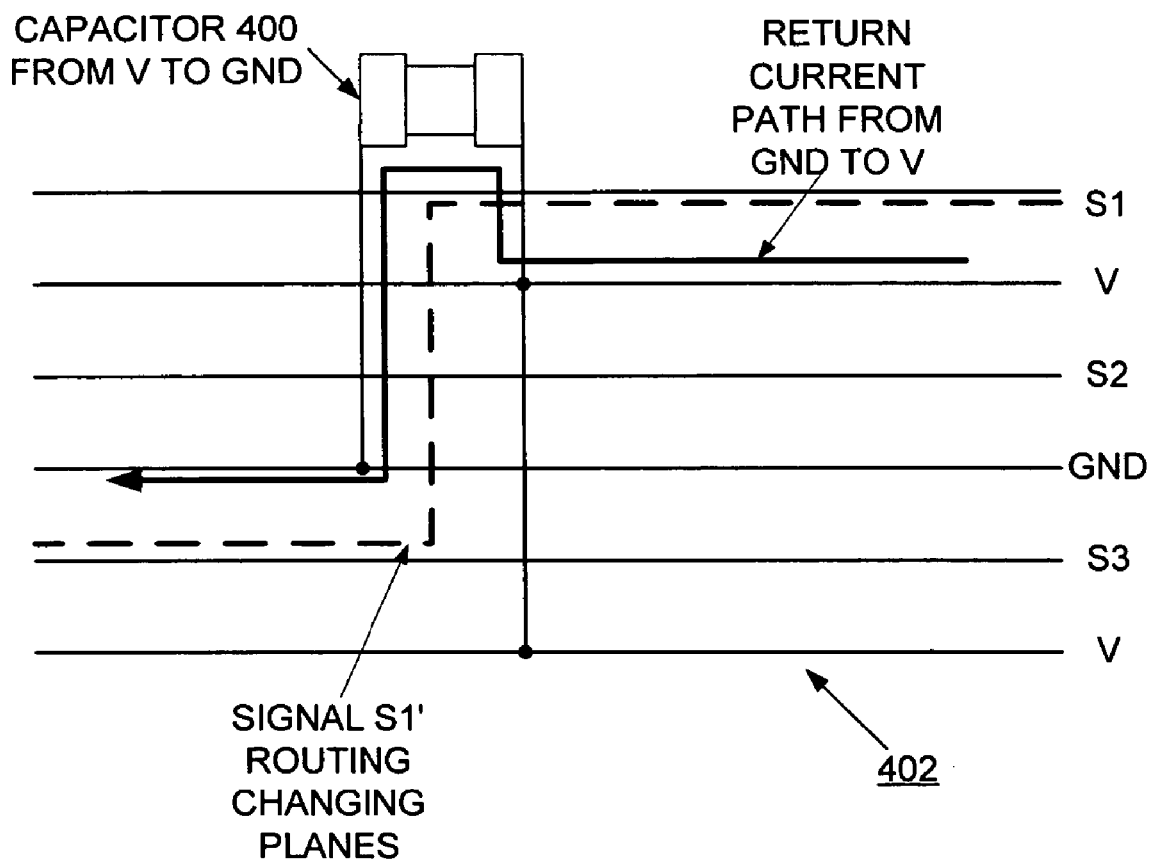
FIGS. 4, 5, and 6 are diagrams illustrating the use of decoupling capacitors for implementing high frequency return current paths in accordance with the preferred embodiment.

FIG. 4 shows a basic example of a signal S1' changing layers, and therefore reference layers, and utilizing a decoupling capacitor 400 added to an electronic package generally designated by reference character 402 for maintaining the return current path in accordance with the method of the preferred embodiment. This method advantageously is applied when application of vias to power or ground does not improve the current return path. More complex structures, such as shown in FIGS. 5 and 6, advantageously are implemented as well utilizing this method of the preferred embodiment.

Figure 5:
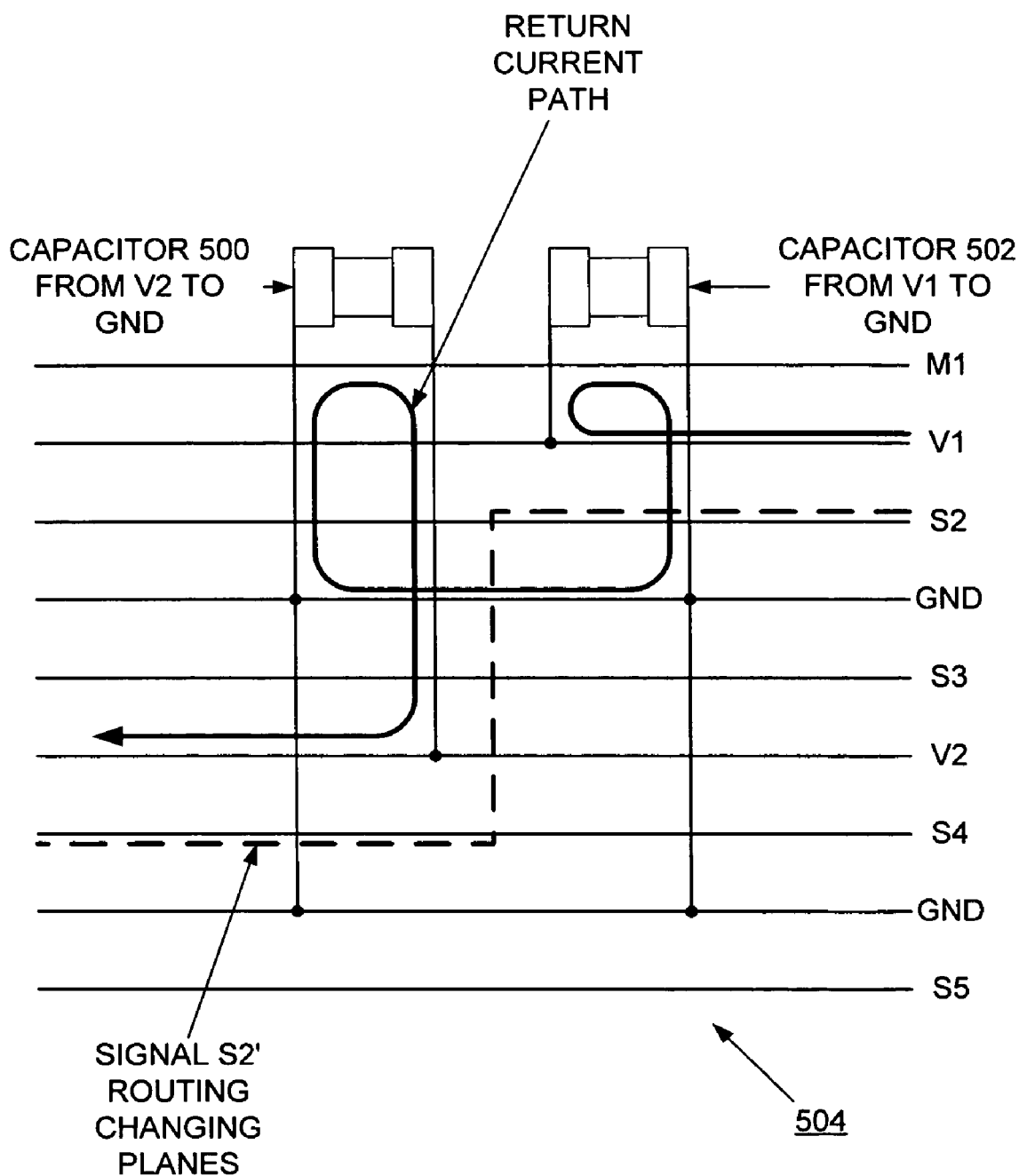
Figure 6:
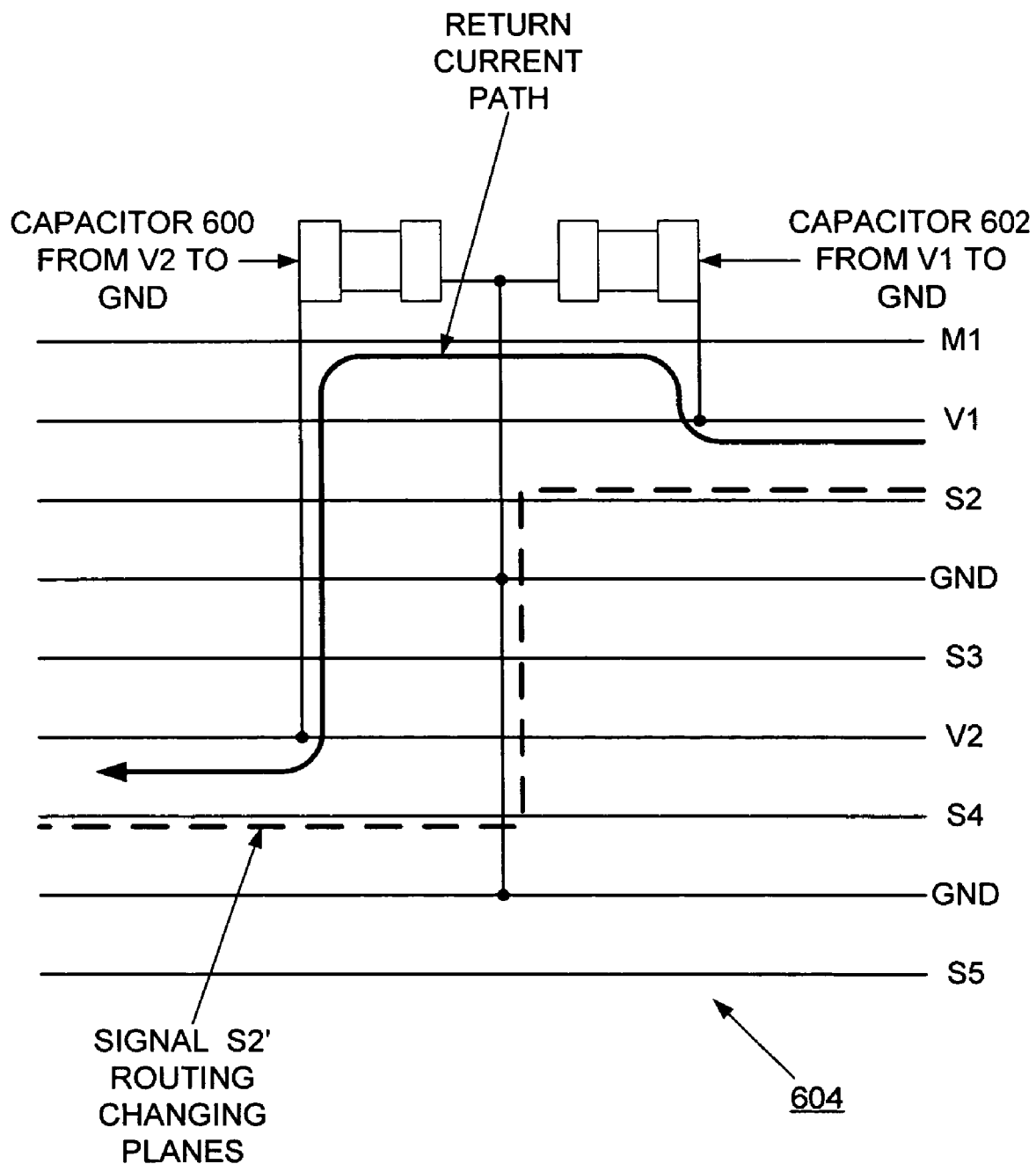

FIGS. 5 and 6 show how utilizing the method of the present invention solves the problem of when a signal S2' changes reference domains when a change in wiring layers occurs utilizing a respective pair of decoupling capacitor 500, 502; 600, 602 added to an electronic package respectively generally designated by reference character 504, 604. The signal routed on S2 induces return currents onto V1 and GND. When the signal changes wiring planes to S4, the return current is now induced onto V2 and GND. Adding in capacitor 500, 600 from V2 to GND and capacitor 502, 602 from V1 to GND in the same region allows for a low impedance path for the return current to flow from V1 to V2, and also connects the two GND layers together as well, as shown in FIGS. 5 and 6.

Figure 7:
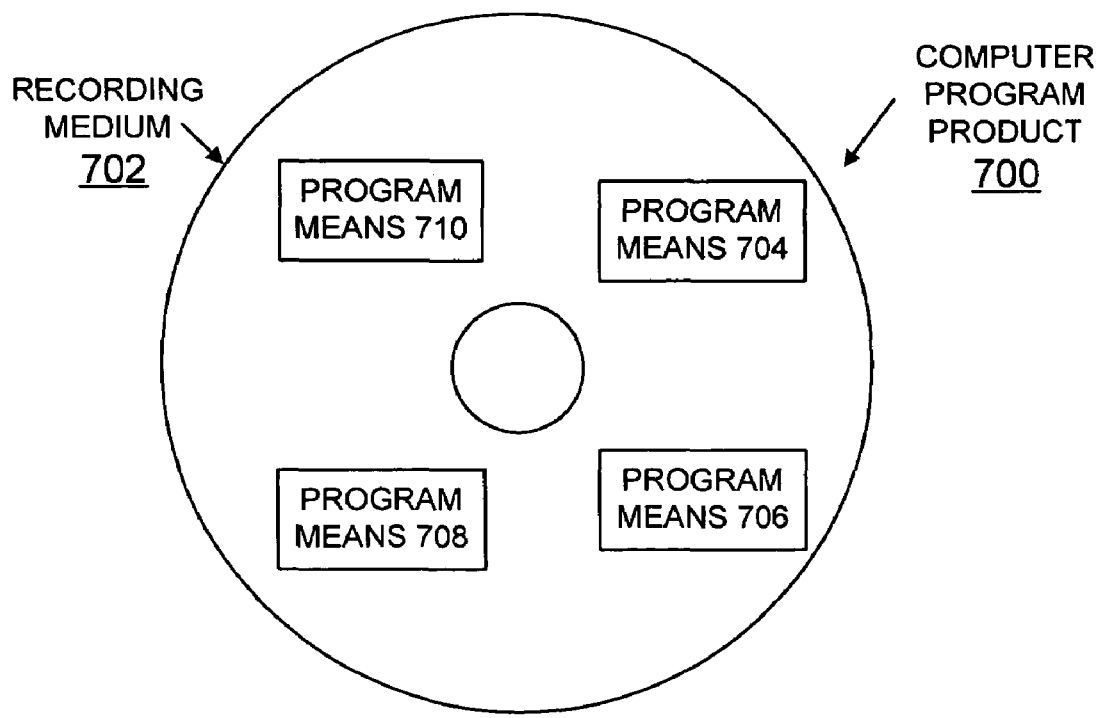
FIG. 7 is a block diagram illustrating a computer program product in accordance with the preferred embodiment.

Referring now to FIG. 7, an article of manufacture or a computer program product 700 of the invention is illustrated. The computer program product 700 includes a recording medium 702, such as, a floppy disk, a high capacity read only memory in the form of an optically read compact disk or CD-ROM, a tape, a transmission type media such as a digital or analog communications link, or a similar computer program product. Recording medium 702 stores program means 704, 706, 708, 710 on the medium 702 for carrying out methods for implementing high frequency return current paths within electronic packages of the preferred embodiment in the system 100 of FIG. 1.

A sequence of program instructions or a logical assembly of one or more interrelated modules defined by the recorded program means 704, 706, 708, 710, direct the computer system 100 for implementing high frequency return current paths within electronic packages of the preferred embodiment.

While the present invention has been described with reference to the details of the embodiments of the invention shown in the drawing, these details are not intended to limit the scope of the invention as claimed in the appended claims.

What is claimed is:

1. A method for implementing high frequency return current paths within electronic packages utilizing decoupling capacitors within electronic packages comprising the steps of:

receiving electronic package physical design data for identifying a design layout;

utilizing said identified design layout for identifying a respective number of signal vias and a respective number of return current paths for a plurality of cells in a grid of a set cell size within said identified design layout;

calculating ratio of signal vias to return current paths for each of said plurality of cells;

identifying each cell having said calculated ratio greater than a target ratio; and selectively adding one or more decoupling capacitors within each said identified cell for providing high frequency return current paths; and receiving a user selected value for said target ratio; said target ratio defining a maximum desired ratio of signal vias to return current paths.

2. The method for implementing high frequency return current paths within electronic packages as recited in claim 1 wherein the step of receiving electronic package physical design data for identifying said board layout includes the steps of receiving plane stack-up data for identifying reference voltages residing on multiple planes and for creating pairs of reference voltages to be analyzed.

3. The method for implementing high frequency return current paths within electronic packages as recited in claim 1 wherein the step of receiving electronic package physical design data for identifying said board layout includes the step of receiving a board file for identifying locations of high speed nets, locations of plane change vias, and board dimensions.

4. The method for implementing high frequency return current paths within electronic packages as recited in claim 1 includes the step of receiving a user selected grid dimensions input defining said set cell size.

5. The method for implementing high frequency return current paths within electronic packages as recited in claim 1 wherein the step of selectively adding one or more decoupling capacitors within each said identified cell for providing high frequency return current paths includes the step of identifying nets referenced to at least one reference voltage within each said identified cell.

6. The method for implementing high frequency return current paths within electronic packages as recited in claim 1 wherein the step of selectively adding one or more decoupling capacitors within each said identified cell for providing high frequency return current paths includes the steps of calculating a capacitance value, a capacitor quantity, and optimal placement for adding said one or more decoupling capacitors within said cell.

7. The method for implementing high frequency return current paths within electronic packages as recited in claim 1 wherein the step of selectively adding one or more decoupling capacitors within each said identified cell for providing high frequency return current paths includes the steps of identifying nets referenced to at least one reference voltage within each said identified cell; and connecting said one or more decoupling capacitors between at least one ground plane and at least one plane for said at least one reference voltage within said cell.

8. The method for implementing high frequency return current paths within electronic packages as recited in claim 1 wherein the step of selectively adding one or more decoupling capacitors within each said identified cell for providing high frequency return current paths includes the steps of identifying nets referenced to at least one reference voltage within each said identified cell; and includes the steps of connecting a first decoupling capacitor between a ground plane and one said reference voltage within said cell; and connecting a second decoupling capacitor between said ground plane and another said reference voltage within said cell.

9. The method for implementing high frequency return current paths within electronic packages as recited in claim 8 includes the step of connecting said first decoupling capacitor and said second decoupling capacitor to a plurality of said ground planes.

10. A computer recording medium for storing a computer program product for implementing high frequency return current paths within electronic packages in a computer system, said computer program product including instructions executed by the computer system to cause the computer system to perform the steps of:

receiving electronic package physical design data for identifying a design layout;

utilizing said identified design layout for identifying a respective number of signal vias and a respective number of return current paths for a plurality of cells in a grid of a set cell size within said identified design layout;

calculating ratio of signal vias to return current paths for each of said plurality of cells;

identifying each cell having said calculated ratio greater than a target ratio; and selectively adding one or more decoupling capacitors within each said identified cell for providing high frequency return current paths; and receiving a user selected value for said target ratio; said target ratio defining a maximum desired ratio of signal vias to return current paths; and receiving a user selected grid dimensions input defining said set cell size.

11. The computer recording medium for storing a computer program product for implementing high frequency return current paths as recited in claim 10 wherein the step of receiving electronic package physical design data for identifying said board layout includes the steps of receiving plane stack-up data for identifying reference voltages residing on multiple planes and for creating pairs of reference voltages to be analyzed.

12. The computer recording medium for storing a computer program product for implementing high frequency return current paths as recited in claim 10 wherein the step of receiving electronic package physical design data for identifying said board layout includes the steps of receiving a board file for identifying locations of high speed nets, locations of plane change vias, and board dimensions.

13. The computer recording medium for storing a computer program product for implementing high frequency return current paths as recited in claim 10 wherein the step of selectively adding one or more decoupling capacitors within each said identified cell for providing high frequency return current paths includes the steps of calculating a capacitance value, a capacitor quantity, and optimal placement for adding said one or more decoupling capacitors within said cell.

14. The computer recording medium for storing a computer program product for implementing high frequency return current paths as recited in claim 10 wherein the step of selectively adding one or more decoupling capacitors within each said identified cell for providing high frequency return current paths includes the steps of identifying nets referenced to at least one reference voltage within each said identified cell; and connecting said one or more decoupling capacitors between at least one ground plane and at least one plane for said at least one reference voltage within said cell.

15. An apparatus for implementing high frequency return current paths utilizing decoupling capacitors within electronic packages comprising:

a return path analyzer computer program for receiving electronic package physical design data for identifying a design layout; utilizing said identified design layout for identifying a respective number of signal vias and a respective number of return current paths for a plurality of cells in a grid of a set cell size within said identified design layout; and for calculating ratio of signal vias to return current paths for each of said plurality of cells;

a capacitor calculation tool computer program for identifying each cell having said calculated ratio greater than a target ratio; and for selectively adding one or more decoupling capacitors within each said identified cell for providing high frequency return current paths; and said return path analyzer computer program receives a user selected value for said target ratio; said target ratio defining a maximum desired ratio of signal vias to return current paths; and receives a user selected grid dimensions input defining said set cell size.

16. The apparatus for implementing high frequency return current paths as recited in claim 15 wherein said electronic package physical design data include plane stack-up data used by said return path analyzer computer program for identifying reference voltages residing on multiple planes and for creating pairs of reference voltages to be analyzed.

17. The apparatus for implementing high frequency return current paths as recited in claim 15 wherein said electronic package physical design data include a board file used by said return path analyzer computer program for identifying locations of high speed nets, locations of plane change vias, and board dimensions.

* * * * *